(12) United States Patent
Chen et al.

(10) Patent No.: US 10,529,702 B2
(45) Date of Patent: Jan. 7, 2020

(54) METHOD AND CIRCUITRY FOR ON-CHIP ELECTRO-STATIC DISCHARGE PROTECTION SCHEME FOR LOW COST GATE DRIVER INTEGRATED CIRCUIT

(71) Applicant: Texas Instruments Incorporated, Dallas, TX (US)

(72) Inventors: Zhong Chen, Plano, TX (US); Danyang Zhu, Beijing (CN); Zhuang Ma, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 273 days.

(21) Appl. No.: 14/533,432

(22) Filed: Nov. 5, 2014

(65) Prior Publication Data

US 2016/0126233 A1     May 5, 2016

(51) Int. Cl.
*H02H 9/00*     (2006.01)
*H01L 27/02*    (2006.01)

(52) U.S. Cl.
CPC .............................. *H01L 27/0255* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 6,894,881 B1* | 5/2005 | Vashchenko | ........ | H01L 27/0255 361/56 |
| 8,278,684 B1* | 10/2012 | Walker | ................ | H01L 27/0262 257/173 |
| 9,172,242 B2* | 10/2015 | Chang | .................... | H02H 9/046 |
| 2002/0080537 A1* | 6/2002 | Landy | ................. | H01L 27/0251 361/56 |
| 2004/0109271 A1* | 6/2004 | Takeda | ................ | H01L 27/0251 361/56 |
| 2006/0018063 A1* | 1/2006 | Boezen | ............... | H01L 27/0255 361/56 |
| 2007/0097581 A1* | 5/2007 | Khazhinsky | ........... | H02H 9/046 361/111 |
| 2009/0296239 A1* | 12/2009 | Shimizu | ........... | B29D 11/00009 359/796 |
| 2010/0061027 A1* | 3/2010 | Jiang | ...................... | H02H 9/046 361/56 |
| 2010/0090306 A1* | 4/2010 | Salih | .................... | H01L 27/0255 257/491 |
| 2010/0188788 A1* | 7/2010 | Padden | ............... | H01L 27/0251 361/56 |
| 2010/0220419 A1* | 9/2010 | Krabbenborg | ...... | H01L 27/0285 361/56 |
| 2010/0246074 A1* | 9/2010 | Venkatasubramanian | .................. | H01L 27/0251 361/56 |
| 2010/0314660 A1* | 12/2010 | Salih | .................... | H01L 27/0255 257/173 |

(Continued)

*Primary Examiner* — Ronald W Leja
(74) *Attorney, Agent, or Firm* — Ronald O. Neerings; Charles A. Brill; Frank D. Cimino

(57) ABSTRACT

An apparatus includes an integrated circuit, a plurality of bi-directional pins, and an electro-static discharge (ESD) clamp. The integrated circuit is configured to provide a ground potential. The plurality of bi-directional pins are configured to provide a differential input signal for the integrated circuit. The electro-static discharge (ESD) clamp is coupled between the ground potential and the plurality of bi-directional pins.

28 Claims, 2 Drawing Sheets

(56) References Cited

U.S. PATENT DOCUMENTS

| | | | |
|---|---|---|---|
| 2011/0092246 A1* | 4/2011 | Ginsburg | H01L 27/0255 455/550.1 |
| 2011/0128657 A1* | 6/2011 | Akai | H01L 27/0285 361/56 |
| 2011/0163352 A1* | 7/2011 | Gee | H01L 23/60 257/173 |
| 2013/0321963 A1* | 12/2013 | Lai | H01L 27/0248 361/56 |
| 2015/0228770 A1* | 8/2015 | Lin | H01L 29/87 257/173 |
| 2016/0013638 A1* | 1/2016 | Glas | H01L 27/0255 361/56 |
| 2016/0126233 A1* | 5/2016 | Chen | H01L 27/0255 361/56 |

* cited by examiner

US 10,529,702 B2

METHOD AND CIRCUITRY FOR ON-CHIP ELECTRO-STATIC DISCHARGE PROTECTION SCHEME FOR LOW COST GATE DRIVER INTEGRATED CIRCUIT

TECHNICAL FIELD

This disclosure is generally directed to an electro static discharge protection scheme.

BACKGROUND

Gate driver integrated circuits (ICs) receive control signals and drive power metal-oxide-semiconductor field-effect transistors (MOSFETs). The traditional gate driver IC typically supports a wide range of positive operating voltage (i.e., −0.3 v to 40 v) for input pins. In many applications, due to the voltage difference between control ground and power ground, system-level clamping/protection devices are used for the input pins to address the reliability concern in the negative operating direction.

A new generation of gate driver ICs incorporate the capability of bi-directional operating range (i.e., −7 v to 40 v) for the input pins to eliminate the system-level clamping devices. The overall system cost is reduced with fewer devices, lower power dissipation and smaller board area. However, providing effective on-chip electro static discharge (ESD) protection is challenging for multiple bi-directional input pins with limited die area. The input pins may also have signal transient up to +/−5V per nanosecond and low leakage requirements.

It would be desirable to provide a specific effective ESD protection topology for low cost gate driver ICs with limited die area, bi-directional operation and low-leakage requirements under fast skew rate conditions.

SUMMARY

This disclosure provides a method and circuitry for on-chip electro-static discharge protection scheme for low cost gate driver integrated circuit.

In a first example embodiment, an apparatus includes an integrated circuit, a plurality of bi-directional pins, and an electro-static discharge (ESD) clamp. The integrated circuit provides a ground potential. The plurality of bi-directional pins provides a differential input signal for the integrated circuit. The ESD clamp is coupled between the ground potential and the plurality of bi-directional pins.

In a second example embodiment, a method of manufacturing an integrated circuit includes providing a support layer. The method also includes forming a plurality of bi-directional pins over the support layer. The plurality of bi-directional pins provides a differential input signal for the integrated circuit. The method also includes forming an ESD clamp over the support layer. The ESD clamp is coupled between the ground potential and the plurality of bi-directional pins.

DETAILED DESCRIPTION

Figure 1:
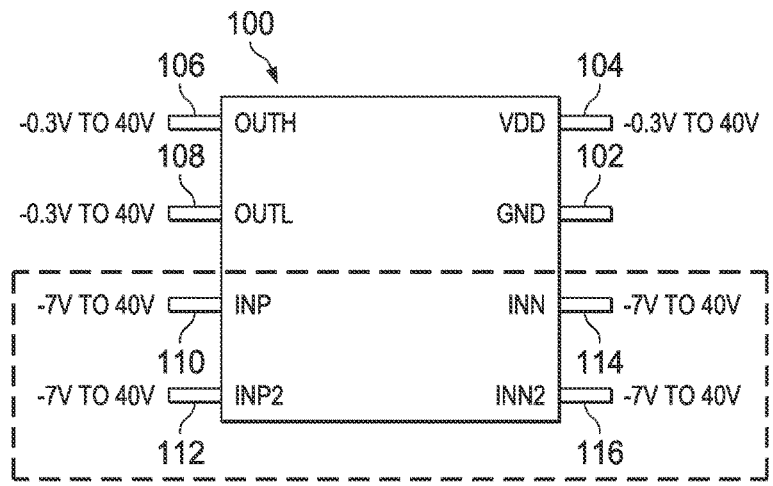
FIG. 1 shows a gate driver according to an embodiment of this disclosure.
Figure 3:
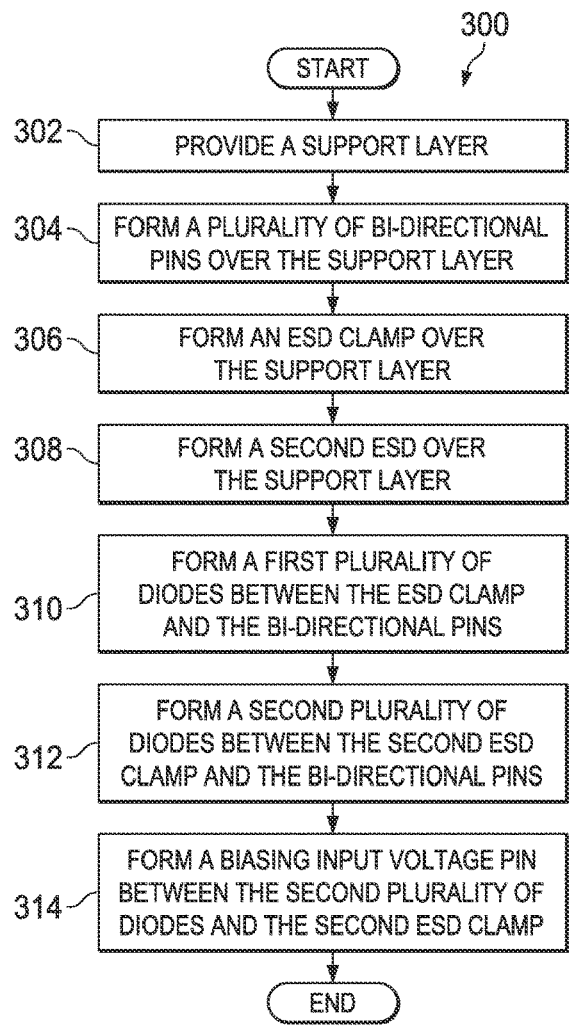
FIG. 3 shows a process of manufacturing a gate driver circuit according to an embodiment of this disclosure.
Figure 2:
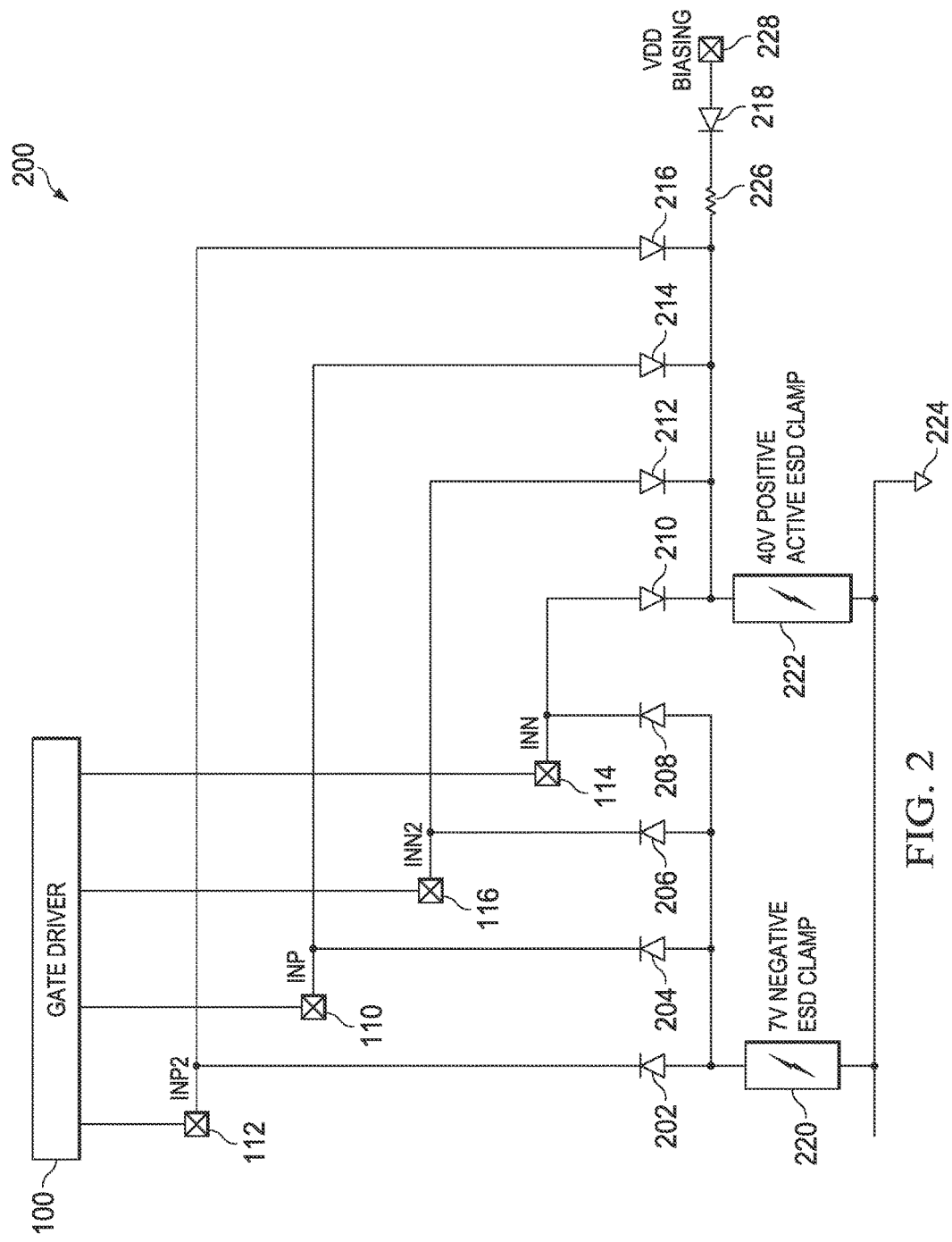
FIG. 2 shows an arrangement according to an embodiment of this disclosure.

FIGS. 1 through 3, discussed below, and the various embodiments used to describe the principles of this disclosure in this patent document are by way of illustration only and should not be construed in any way to limit the scope of the disclosure. Those skilled in the art will understand that the principles of this disclosure may be implemented in any power system.

A gate driver is a power amplifier that accepts a low-power input from a controller IC and produces a high-current drive input for the gate of a high-power transistor such as, but not limited to, an insulated-gate bipolar transistor (IGBT) or power metal-oxide-semiconductor field-effect transistor (MOSFET). Gate drivers can be provided either on-chip or as a discrete module. A gate driver may include a level shifter in combination with an amplifier. The isolated gate-electrode of the MOSFET forms a capacitor (gate capacitor), which must be charged or discharged each time the MOSFET is switched on or off. As a transistor requires a particular gate voltage in order to switch on, the gate capacitor must be charged to at least the required gate voltage for the transistor to be switched on. Similarly, to switch the transistor off, this charge must be dissipated, i.e. the gate capacitor must be discharged.

When a transistor is switched on or off, it does not immediately switch from a non-conducting state to a conducting state; and may transiently support both a high voltage and conduct a high current. Consequently, when gate current is applied to a transistor to cause it to switch, a certain amount of heat is generated which can, in some cases, be enough to destroy the transistor. Therefore, it is desirable to keep the switching time as short as possible, so as to minimize switching loss. Typical switching times are in the range of nanoseconds. The switching time of a transistor is inversely proportional to the amount of current used to charge the gate. Therefore, switching currents are often required in the range of several hundred milliamperes, or even in the range of amperes. For typical gate voltages of approximately 10-15V, several watts of power may be required to drive the switch. When large currents are switched at high frequencies, (e.g. in DC-to-DC converters of large electric motors), multiple transistors are sometimes provided in parallel, so as to provide sufficiently high switching currents and switching power.

The switching signal for a transistor is usually generated by a logic circuit or a microcontroller, which provides an output signal that often is limited to a few milliamperes of current. Consequently, a transistor which is directly driven by such a signal would switch very slowly, with correspondingly high power loss. During switching, the gate capacitor of the transistor may draw current so quickly that it causes a current overdraw in the logic circuit or microcontroller, causing overheating which leads to permanent damage or even complete destruction of the chip. To prevent this from happening, a gate driver can be provided between the microcontroller output signal and the power transistor.

FIG. 1 shows a gate driver 100 according to an embodiment of this disclosure. The embodiment of the gate driver 100 shown in FIG. 1 is for illustration only. Other embodiments of the gate driver 100 could be used without departing from the scope of this disclosure.

As shown in FIG. 1, the gate driver 100 can be a low cost gate driver integrated circuit. In an example embodiment, the gate driver 100 includes pins 102-116. One or more of the pins may be bi-directional pins. For example, in one embodiment, the pins 110-116 are bi-directional pins. One or more embodiments of this disclosure recognize and take into account that gate drivers have high positive pin operating voltages, multiple input pins with bi-directional operations, limited die size, signal transients up to 5V per nanosecond, and low leakage requirements. The pin 102 may be a ground of the gate driver 100. The pin 102 may be designated by GND. The pin 104 may be a biasing input voltage of gate driver 100. The pin 104 may be designated by VDD.

In an example embodiment, the gate driver IC 100 can be single-channel, high-speed, gate driver capable of effectively driving MOSFET and IGBT power switches. The gate driver IC 100 can also include a split-output configuration where the gate-drive current is sourced through the OUTH pin 106 and sunk through the OUTL pin 108. This pin arrangement allows the user to apply independent turn-on and turn-off resistors to the OUTH and OUTL pins respectively and easily control the switching slew rates.

The pin 106 may be a high-level output voltage while the pin 108 may be a low-level output voltage of the gate driver 100. The pin 106 may be represented by OUTH and connects to a gate of a MOSFET. The pin 108 may be represented by OUTL and connects to a gate of a MOSFET. The pins 106 and 108 may be connected to the same gate of a single MOSFET or to gates of separate MOSFETs individually.

The gate driver 100 may receive respective polarity signals INN and INP forming a differential input signal, where INP is the non-inverting input (or positive input "+") and INN is the inverting input (or negative input "−"). The pin 110 is a bi-directional pin for a positive input INP for the internal comparator. The pins 110-112 may connect to the source of a MOSFET. The pin 112 is a second positive input pin INP2 for a second MOSFET. The pin 114 is a bi-directional pin for a negative input INN for the internal comparator. The pin 116 is a second negative input pin INN2 for a second MOSFET. The pins 114-116 may connect to the drain of a MOSFET.

FIG. 2 shows an arrangement 200 according to an embodiment of this disclosure. The embodiment of the arrangement 200 shown in FIG. 2 is for illustration only. Other embodiments of the arrangement 200 could be used without departing from the scope of this disclosure.

As shown in FIG. 2, the arrangement 200 may be an ESD protection scheme. In an example embodiment, the arrangement 200 includes the pins 110-116 coupled with gate driver 100 as shown in FIG. 1, diodes 202-218, a negative clamp 220, a positive clamp 222, a ground 224, a resistor 226, and a biasing input voltage 228.

In the arrangement 200, each pin 110-116 is connected to the ground 224 through parallel diodes, the negative clamp 220, and the positive clamp 222. For example, the pin 114 is connected to the ground 224 through the diode 208 and the negative clamp 220 on a first path and the diode 210 and the positive clamp 222 on a second path. Likewise, the pin 116 is connected to the ground 224 through the diode 206 and the negative clamp 220 on a first path and the diode 212 and the positive clamp 222 on a second path. Additionally, the pin 110 is connected to the ground 224 through the diode 204 and the negative clamp 220 on a first path and the diode 214 and the positive clamp 222 on a second path. Further, the pin 112 is connected to the ground 224 through the diode 202 and the negative clamp 220 on a first path and the diode 216 and the positive clamp 222 on a second path. The first path and second path of each pin may be in parallel.

In an embodiment of this disclosure, the negative clamp 220 and the positive clamp 222 may be types of a voltage clamp, which ensures that a sudden surge in voltage from an ESD event can be safely discharged so that no damage results to the internal active devices of the integrated circuit. In one example, the negative clamp 220 or the positive clamp 222 may be static clamps providing a static or steady-state current and voltage response. As long as the voltage is above a fixed voltage level, the voltage clamp can conduct current. In different examples, the negative clamp 220 or the positive clamp 222 may be a diode, MOSFET, silicon controlled rectifier (SCR) based clamp, or a combination of two or more of these.

In another example, the negative clamp 220 or the positive clamp 222 may be transient clamps. The negative clamp 220 or the positive clamp 222 may take advantage of the rapid changes in voltage or current that accompanies an ESD event. During the rapid change in voltage, an element is turned on very quickly and slowly turns off.

Different embodiments of this disclosure provide separating the high voltage positive clamp and low voltage negative clamp such that multiple IO pins could share one large positive clamp and benefit from the low ESD clamp voltage for the positive direction. The total voltage clamp layout area is reduced as well. Low ESD clamping voltage on multiple high voltage JO pins can prevent parasitic components (i.e., parasitic NPN, parasitic SCR) turn-on during ESD conditions. Separating positive and negative ESD cells allows biasing the common floating net connected between the blocking diode and the high-voltage ESD cell. After biasing the floating net, the diode connected to the positive ESD cell is reverse-biased during normal operations. The fast signal transient immunity can be achieved for the ESD cells on JO pins.

FIG. 3 is a process 300 of manufacturing a gate driver circuit according to embodiment of this disclosure. The process is described with respect to the gate driver 100 as shown in FIG. 1. The embodiment of the process 300 shown in FIG. 3 is for illustration only. Other embodiments of the process 300 could be used without departing from the scope of this disclosure.

At step 302, a support layer is provided. The support layer may be a printed circuit board, or some other type of non-conductive or semi-conductive layer. At step 304, a plurality of bi-directional pins are formed over the support layer. The plurality of bi-directional pins provide a differential input signal for the gate driver circuit.

At step 306, an electro-static discharge (ESD) clamp is formed over the support layer. The ESD clamp is coupled between a ground potential and the plurality of bi-directional pins. At step 308, a second ESD clamp is formed that is coupled between the ESD clamp and the ground potential. The ESD clamp and the second ESD clamp may be arranged in parallel. In an embodiment, one of the ESD clamps is a positive clamp and one is a negative clamp.

At step 310, a first plurality of diodes are formed that are coupled between each bi-directional pin and the ESD clamp. In an example, a cathode of each diode of the plurality of diodes is coupled to the plurality of bi-directional pins and an anode of each diode to the ESD clamp. At step 312, a second plurality of diodes are formed that are coupled between each bi-directional pin and the second ESD clamp. In an example, an anode of each diode of the plurality of diodes is coupled to the plurality of bi-directional pins and a cathode of each diode to the second ESD clamp.

At step 314, a biasing input voltage pin of the gate driver circuit is formed that is coupled between the second plurality of diodes and the second ESD clamp.

Although FIG. 3 illustrates one example of a method 300 of manufacturing a gate driver circuit, various changes may be made to FIG. 3. For example, while shown as a series of steps, various steps in FIG. 3 could overlap, occur in parallel, occur in a different order, or occur any number of times. Additionally, while the method 300 has been described with respect to the gate driver 100, the method 300 may also be used with any other suitable devices.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus, comprising:
   a circuit;
   a ground potential pin configured to transfer a ground potential to the circuit;
   four or more bi-directional pins, each configured to transfer an input voltage to the circuit, the input voltage having a bipolar range;
   four or more diodes, each diode having a cathode coupled to one of the four or more bi-directional pins respectively; and
   a negative transient-electro-static discharge (ESD) clamp coupled between the ground potential pin and an anode of each of the four or more diodes.

2. The apparatus of claim 1, further comprising:
   a second set of four or more diodes, each diode having an anode coupled to one of the four or more bi-directional pins respectively; and
   a positive ESD clamp coupled between the ground potential pin and a cathode of each of the second set of the diodes.

3. The apparatus of claim 2, further comprising:
   a biasing input voltage pin coupled to the positive ESD clamp.

4. The apparatus of claim 2, wherein the positive ESD clamp is directly connected to the ground potential pin.

5. The apparatus of claim 2, wherein the positive ESD clamp and negative transient ESD clamp are directly connected to the ground potential pin.

6. The apparatus of claim 2, wherein the positive ESD clamp is a positive transient ESD clamp.

7. The apparatus of claim 1, further comprising a positive ESD clamp arranged in parallel with the negative transient ESD clamp.

8. The apparatus of claim 7, further comprising:
   a biasing input voltage pin coupled to the positive ESD clamp.

9. The apparatus of claim 7, further comprising:
   a diode coupling the biasing input voltage pin to the positive ESD clamp.

10. The apparatus of claim 7, wherein the positive ESD clamp is a positive transient ESD clamp.

11. The apparatus of claim 1, wherein the negative transient ESD clamp is directly connected to the ground potential pin.

12. An apparatus, comprising:
    a circuit;
    a ground potential pin configured to transfer a ground potential to the circuit;
    four or more bi-directional pins, each configured to transfer an input voltage to the circuit, the input voltage having a bipolar range;
    four or more diodes, each diode having cathode coupled to one of the four or more bi-directional pins respectively;
    a negative transient electro-static discharge (ESD) clamp coupled between the ground potential pin and an anode of each of the four or more diodes; and
    a second ESD clamp coupled between the negative transient ESD clamp and the ground potential pin.

13. The apparatus of claim 12, further comprising:
    a second set of four or more diodes, each diode having an anode coupled to one of the four or more bi-directional pins respectively; and
    a positive ESD clamp coupled between the ground potential pin and a cathode of each of the second set of the diodes.

14. The apparatus of claim 13, further comprising:
    a biasing input voltage pin coupled to the positive ESD clamp.

15. The apparatus of claim 13, wherein the positive ESD clamp is a positive transient ESD clamp.

16. A method of manufacturing an integrated circuit, the method comprising:
    providing a circuit;
    providing a ground potential pin configured to transfer a ground potential to the circuit;
    providing four or more bi-directional pins, each configured to transfer an input voltage to the circuit, the input voltage having a bipolar range;
    providing four or more diodes, each diode having a cathode coupled to one of the four or more bi-directional pins respectively; and
    providing a negative transient electro-static discharge (ESD) clamp coupled between the ground potential pin and an anode of each of the four or more diodes.

17. The method of claim 16, further comprising:
    providing a second set of four or more diodes, each diode having an anode coupled to one of the four or more bi-directional pins respectively; and
    providing a positive ESD clamp coupled between the ground potential pin and a cathode of each of the second set of the diodes.

18. The method of claim 17, further comprising:
    coupling a biasing input voltage pin to the positive ESD clamp.

19. The method of claim 17, wherein the positive ESD clamp is directly connected to the ground potential pin.

20. The method of claim 17, wherein the positive ESD clamp and negative transient ESD clamps are directly connected to the ground potential pin.

21. The method of claim 17, wherein the positive ESD clamp is a positive transient ESD clamp.

22. The method of claim 16, further comprising providing a positive ESD clamp arranged in parallel with the negative transient ESD clamp.

23. The method of claim 22, further comprising:
coupling a biasing input voltage pin to the positive ESD clamp.

24. The method of claim 19, further comprising:
coupling a biasing input voltage pin to the positive ESD clamp.

25. The method of claim 16, wherein the negative transient ESD clamp is directly connected to the ground potential pin.

26. A method of manufacturing an integrated circuit, the method comprising:
providing a circuit;
providing a ground potential pin configured to transfer a ground potential to the circuit;
providing four or more bi-directional pins, each configured to transfer an input voltage to the circuit, the input voltage having a bipolar range;
providing four or more diodes, each diode having an anode coupled to one of the four or more bi-directional pins respectively;
providing a negative transient electro-static discharge (ESD) clamp coupled between the ground potential pin and an anode of each of the four or more diodes; and
providing a second ESD clamp coupled between the negative transient ESD clamp and the ground potential pin.

27. The method of claim 26, further comprising:
providing a second set of four or more diodes, each diode having an anode coupled to one of the four or more bi-directional pins respectively; and
providing a positive ESD clamp coupled between the ground potential pin and a cathode of each of the second set of the diodes.

28. The method of claim 27, wherein the positive ESD clamp is a positive transient ESD clamp.

* * * * *